United States Patent [19]
Van Buskirk et al.

[11] Patent Number: 5,335,198
[45] Date of Patent: Aug. 2, 1994

[54] FLASH EEPROM ARRAY WITH HIGH ENDURANCE

[75] Inventors: Michael A. Van Buskirk; Kevin W. Plouse, both of San Jose; Joseph G. Pawletko, Sunnyvale; Chi Chang, Redwood City; Sameer S. Haddad, San Jose; Ravi P. Gutala, Sunnyvale, all of Calif.

[73] Assignee: Advanced Micro Devices, Inc., Sunnyvale, Calif.

[21] Appl. No.: 57,583

[22] Filed: May 6, 1993

[51] Int. Cl.⁵ .............................................. G11C 29/00
[52] U.S. Cl. ...................................... 365/185; 365/218
[58] Field of Search .................. 365/218, 185, 189.01, 365/104, 210

[56] References Cited

U.S. PATENT DOCUMENTS

| 5,122,985 | 6/1992 | Santin | 365/185 |
|---|---|---|---|
| 5,142,496 | 8/1992 | Van Buskirk | 365/218 |
| 5,233,562 | 8/1993 | Ong et al. | 365/218 |
| 5,237,535 | 8/1993 | Melke et al. | 365/218 |

Primary Examiner—Eugene R. LaRoche
Assistant Examiner—Vu Le
Attorney, Agent, or Firm—Davis Chin

[57] ABSTRACT

An over-erased bit correction structure is provided for performing a correction operation on over-erased memory cells in an array of flash EEPROM memory cells during programming operations so as to render high endurance. Sensing circuitry (23) is used to detect column leakage current indicative of an over-erased bit. If an over-erased bit is determined, a pulse counter (25) is activated so as to apply programming pulses to the control gate of the selected memory cell so as to program back the negative threshold voltage of the over-erased bit to a positive voltage.

18 Claims, 10 Drawing Sheets

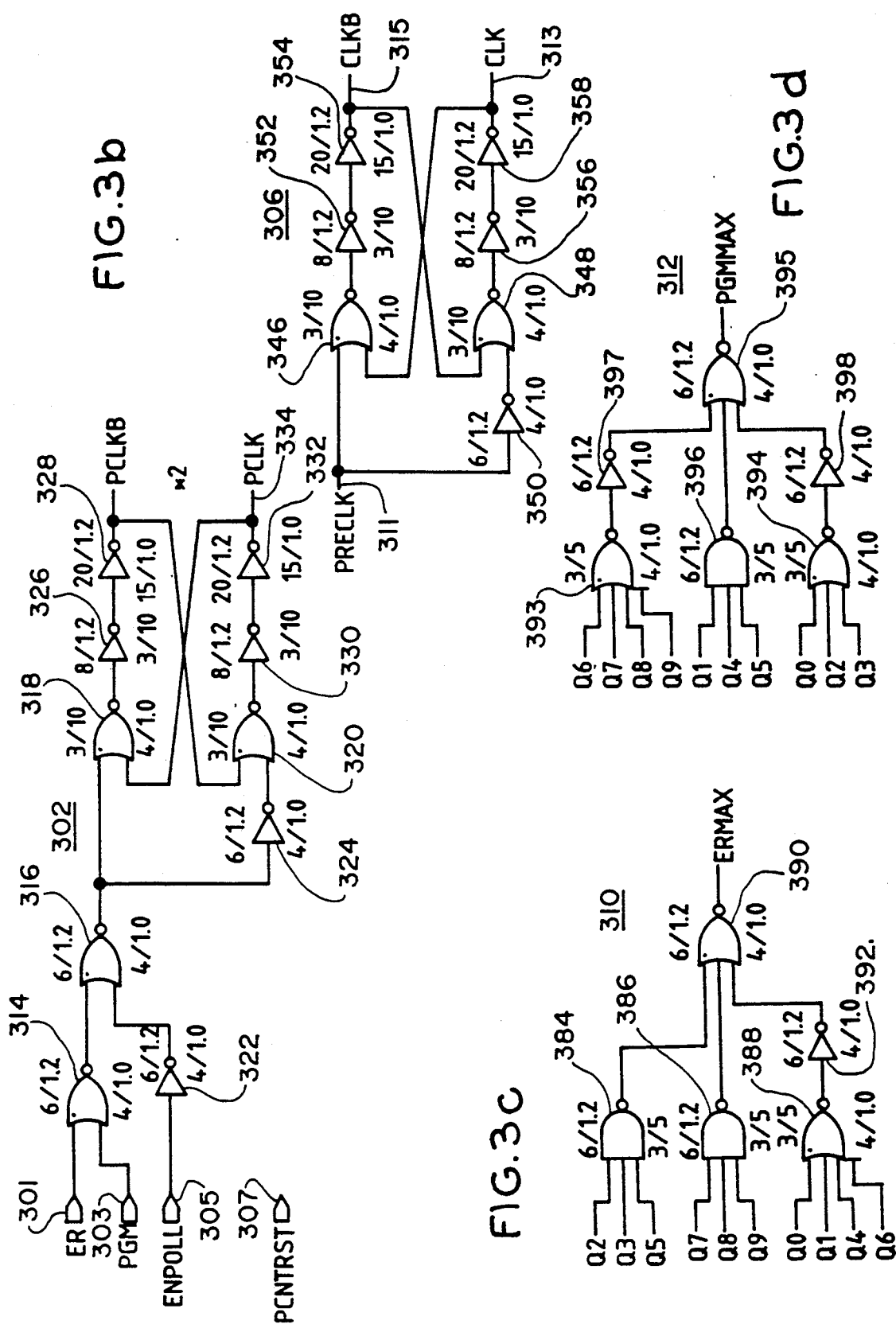

5,335,198

FLASH EEPROM ARRAY WITH HIGH ENDURANCE

BACKGROUND OF THE INVENTION

This invention relates generally to floating gate memory devices such as an array of flash electrically erasable programmable read-only memory (EEPROM) cells. More particularly, the present invention relates to a semiconductor integrated circuit memory device having an over-erased bit correction structure for performing a correction operation on over-erased memory cells in an array of flash EEPROM memory cells during program operation so as to render high endurance.

As is generally known, in recent years a new category of electrically erasable EPROMs/EEPROMs has emerged as an important non-volatile memory which combines the advantages of EPROM density with EEPROM electrical erasability and are sometimes referred to as "flash" EPROM or EEPROM. In these flash memories, a plurality of one-transistor flash EEPROM cells may be formed on a semiconductor substrate in which each cell is comprised of a P-type conductivity substrate, an N-type conductivity source region formed integrally within the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

In order to program the flash EEPROM cell, the drain region and the control gate are raised to predetermined potentials above the potential applied to the source region. For example, the drain region has applied thereto a voltage $V_D$ of approximately +5.5 volts with the control gate $V_G$ having a voltage of approximately +12 volts applied for approximately two or three microseconds. These voltages produce "hot electrons" which are accelerated across the thin dielectric layer and onto the floating gate. This hot electron injection results in an increase of the floating gate threshold by approximately two to four volts.

In order to erase the flash EEPROM cell, a relatively high positive potential (i.e., +12 volts) is applied to the source region for a few tenths of a second. The control gate is grounded, and the drain region is allowed to float. A strong electric field develops between the floating gate and the source region, and negative charge is extracted from the floating gate to the source region by way of Fowler-Norheim tunneling. If an unprogrammed flash EEPROM cell in an array of such cells is repeatedly erased under these conditions, the floating gate will eventually acquire a more positive potential. Consequently, even with the control gate being grounded the cell will always be turned on which causes column leakage current thereby preventing the proper reading of any other cell in the column of the array containing this cell as well as making programing of the other cells on the same column increasingly more difficult. This condition is referred to as "bit over-erase" which is disadvantageous since the data programming characteristics of the memory cell is deteriorated so as to cause endurance failures.

An over-erased condition must be avoided in order to prevent the one-transistor flash EEPROM cell from being a depletion-like transistor in the read mode of operation. During this read mode of operation an over-erased memory cell will disable a whole column of a memory array if these memory cells are structured as an array. As used herein, the term "endurance" refers to the number of times the memory cell may be re-programmed and erased. Consequently, the bit over-erased condition significantly reduces the endurance of the memory cell.

In order to determine whether the EEPROM cell has been programmed or not, the magnitude of the read current is measured. Typically, in the read mode, the source region is held at a ground potential (0 volts) and the control gate is held at a potential of about +5 volts. The drain region is held at a potential between 1 to 2 volts. Under these conditions, an unprogrammed cell will conduct at a current level of approximately 50 to 100 uA. The programmed cell will have considerably less current flowing.

To fabricate memory devices of the EEPROM type with a high endurance which have a large memory capacity (i.e., greater than one million bits), there has arisen a need to provide an apparatus for correcting over-erased bits in an array of flash EEPROM memory cells during its program operation so as to enhance its endurance. Therefore, it is important to be able to detect array column leakage current indicative of an over-erased bit and to correct such over-erased bit during the time when another cell in the same column is being programmed. In the event that an over-erased bit is found to exist (the array transistor having a negative threshold voltage of −2 or −3 volts), a pulse generator is activated so as to apply programming pulses to the control gate of the selected memory cell being programmed. Since the control gate of the non-selected memory cells in the same column containing the over-erased bit is provided with zero volts and the common source regions are tied to a ground potential, the programming pulses will also serve to program back the negative threshold voltages of the over-erased bits to a more positive threshold voltage (i.e., +1 volt which is dependent on several parameters), thereby reducing the column leakage current.

SUMMARY OF THE INVENTION

Accordingly, it is a general object of the present invention to provide a semiconductor integrated circuit memory device having an over-erased bit correction structure for performing a correction operation on over-erased memory cells in the memory device on an efficient and effective basis.

It is an object of the present invention to provide an over-erased bit correction structure for performing a correction operation on over-erased memory cells in an array of flash EEPROM memory cells during program operation so as to render high endurance.

It is another object of the present invention to provide an over-erased bit correction structure which includes a pulse counter circuit for generating a plurality of programming pulses to the control gate of the selected memory cell being programmed so as to program back all over-erased memory cells connected to the same column as the selected memory cell.

It is still another object of the present invention to provide an over-erased bit correction structure which includes sensing circuitry for changing the ratio between array column leakage current and a reference current so as to determine the endurance of the memory array.

In accordance with these aims and objectives, the present invention is concerned with the provision of a semiconductor integrated circuit memory device having an over-erased bit correction structure for performing a correction operation on over-erased memory cells in the memory device. The correction structure includes a cell matrix having a plurality of memory cells arranged in rows of word lines and columns of bit lines intersecting the rows of word lines. Each of the memory cells includes a floating gate array transistor. A row decoder is responsive to row address signals and is operatively connected to the cell matrix for selecting one of the rows of word lines. A column decoder is responsive to column address signals and is operatively connected to the cell matrix for selecting one of the columns of bit lines. A reference column having a plurality of reference cells is arranged in rows of word lines corresponding to the number of rows in the cell matrix. Each of the reference cells includes a reference cell transistor.

The correction structure further includes a sensing circuit for comparing array leakage current in the selected one of the columns of bit lines and a reference current in the reference column during a program verify mode of operation and for generating a logic signal which is at a high logic level when the bit line leakage current is greater than the reference current indicative of an over-erased memory cell and which is at a low logic level when the bit line leakage current is less than the reference current indicative of a properly programmed memory cell. A pulse counter is coupled to the row decoder for providing a plurality of programming pulses to the selected row of word lines during programming until the logic level generated by the sensing circuitry is at the low logic level so as to program back all over-erased memory cells connected to the selected one of the columns of bit lines.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 3(a) through 3(d), when connected together is a detailed schematic circuit diagram of the pulse counter circuit of FIG. 2;

DESCRIPTION OF THE PREFERRED EMBODIMENT

An apparatus for correcting over-erased memory cells in an array of flash EEPROM memory cells fabricated on a silicon substrate is described. In the following description, numerous specific details are set forth, such as specific circuit configurations, components, and the like in order to provide a thorough understanding of the present invention. However, it should be apparent to those skilled in the art that the present invention may be practice without these specific details. In other instances, well-known processes, circuits, and control lines, not particularly relevant to the understanding of the operating principles of the present invention, have been purposely omitted for the sake of clarity.

In order to fabricate flash memory devices of the EEPROM type with a high endurance, this is achieved in the present invention by correcting over-erased bits in the array of flash EEPROM memory cells during program operation. The array column leakage current is compared with a reference current during a program verify mode so as to determine over-erased bits. If an over-erased bit is determined, a pulse counter is activated so as to apply programming pulses to the control gate of the selected memory cell so as to program back the negative threshold voltage of the over-erased bits.

Figure 1:
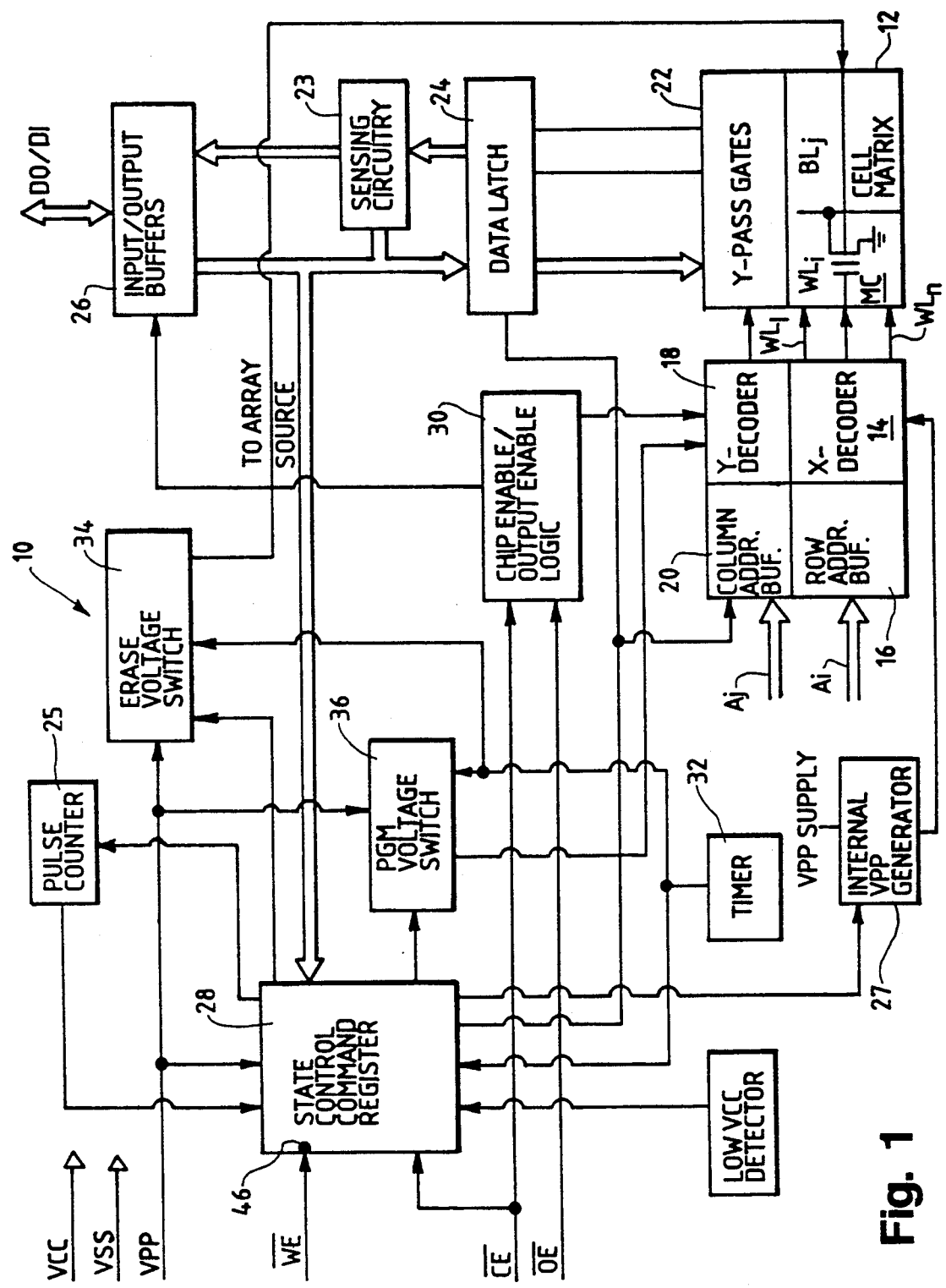
FIG. 1 is a block diagram of a semiconductor integrated circuit memory device having an over-erased bit correction structure, constructed in accordance with the principles of the present invention.

Referring now in detail to the drawings, there is shown in FIG. 1 a block diagram of a semiconductor integrated circuit memory device 10 which includes an over-erased bit correction structure of the present invention for performing a correction operation on over-erased memory cells in an array of flash electrically erasable programmable read-only memory (EEPROM) cells of the memory device 10 during programming so as to render high endurance. The correction structure in the remaining portions of the memory device 10 are both wholly formed on a single semiconductor substrate by known CMOS integrated circuit technology.

The EEPROM semiconductor memory device 10 includes a cell matrix 12 formed of a plurality of memory cells (one of which is shown) arranged on the semiconductor chip. The cell matrix 12 is accessed by row address signals $A_i$ and column address signals $A_j$. The row address signals $A_i$ are fed to a row address decoder 14 via a row address buffer 16 including a latch circuit, for selecting one of the word lines $WL_l$-$WL_n$, i.e., $WL_i$. At the same time, the column address signals $A_j$ are fed to a column address decoder 18 via a column address buffer 20 including a latch circuit. The outputs of the column address decoder 18 are used to drive a Y-pass gate circuit 22 for selecting one of the bit lines $BL_l$-$B_n$, i.e., $BL_j$.

The data stored in the selected memory cell MC is read by sensing circuitry 23 via the Y-pass gate circuit 22 and a data latch 24. The output of the sensing circuitry 23 is used to drive the input/output buffers 26 for providing an output data DO. On the other hand, in a write mode, an input data DI is sent to the data latch 24 via the input/output buffer 26 and is then passed to the selected bit line via the Y-pass gate circuit 22.

The overall control of the programming, reading, and erasing operations is achieved by a state control command register (state machine) 28 and a chip enable/output enable logic circuit 30. The state machine 28 receives the write enable signal $\overline{WE}$, a chip enable signal $\overline{CE}$, a power source high voltage VPP, and a timing signal from the timer 32. The logic circuit 30 receives also the chip enable signal $\overline{CE}$ and an output enable signal $\overline{OE}$. The state machine 28 and the logic circuit 30 provide a variety of control signals for an erase voltage switch 34, a PGM voltage switch 36, the input/output buffers 26, the data latch 24, and the column decoder 18. A pulse counter 25 is controlled by the state machine 28 and is used to provide up to 6,000 programming pulses via an internal VPP generator 27 and the X-decoder 14 to the word line (control gate) of the selected memory cell. The VPP generator 27 is used to supply the word line with the proper voltage during the programming verify mode of operation (i.e., +6 volts). The sensing circuitry 23 is also controlled by the state machine 28 and includes means for detecting array column leakage current indicative of an over-erased bit connected to the same column in which the selected memory cell is being programmed.

Figure 2:
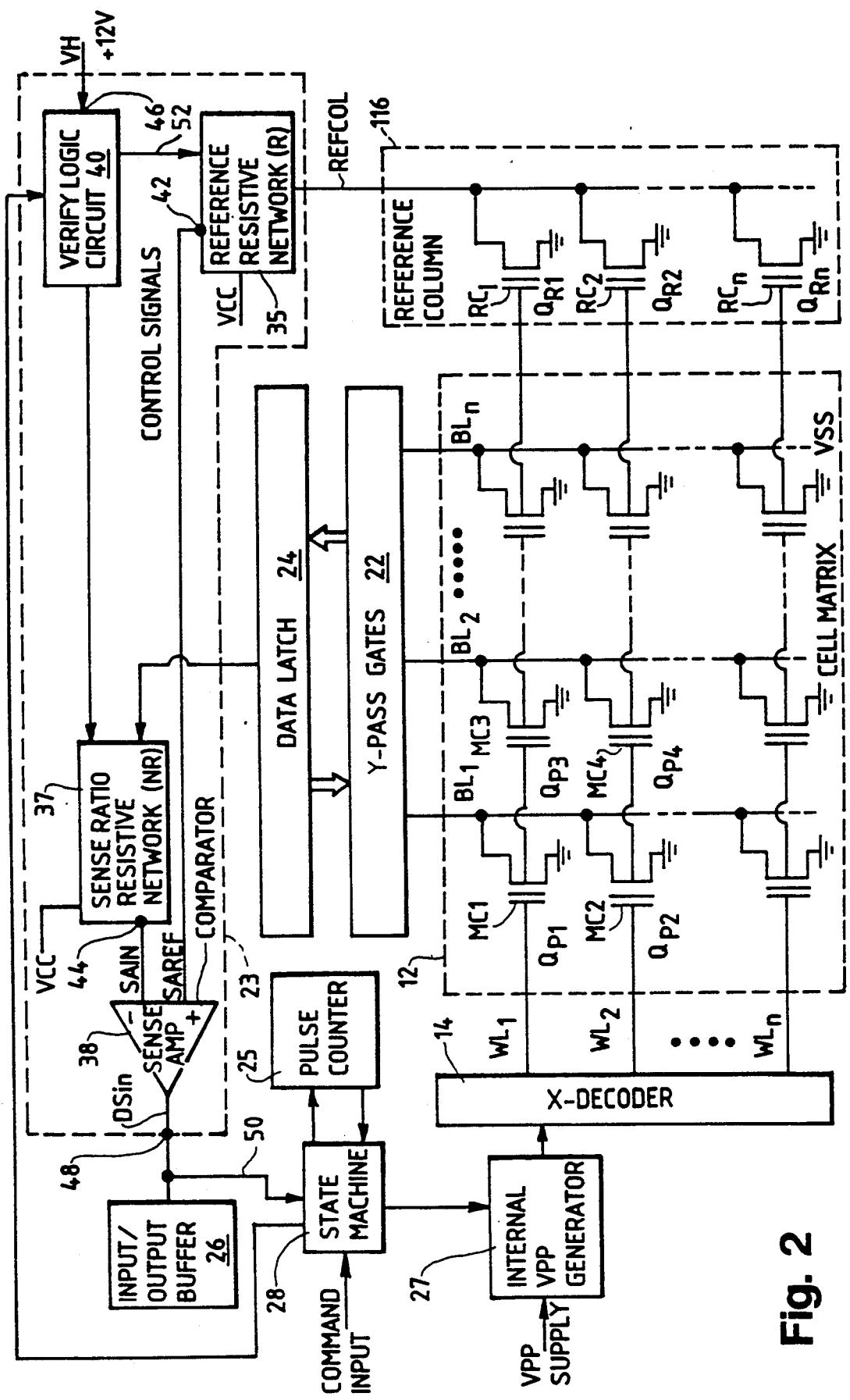
FIG. 2 is a simplified schematic circuit diagram of certain portions of the memory device of FIG. 1 with the correction structure.
Figure 3A:
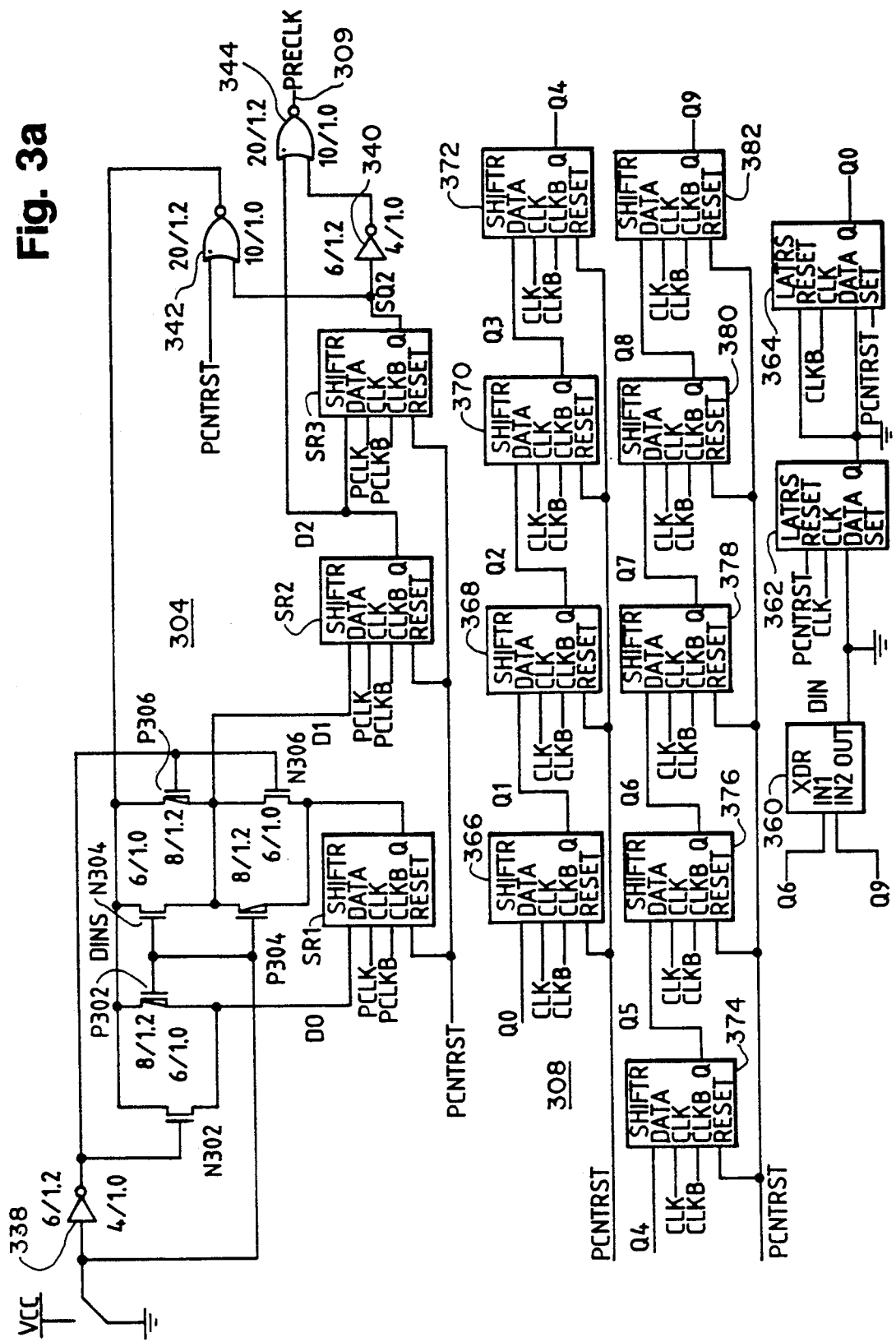

In the aforementioned EEPROM type semiconductor memory device 10, the present invention is particularly concerned with the over-bit correction structure in relationship to the memory cells MC. The correction structure is essentially comprised of the sensing circuitry 23, the pulse counter 25 and the internal VPP generator 27, all controlled by the state machine 28. Accordingly, a detailed explanation will be first given regarding the memory cells and then an explanation will be given concerning the correction structure. In FIG. 2, there is illustrated a simplified schematic circuit diagram of certain portions of the memory device of FIG. 1 and the correction structure. As can be seen, the memory cells MC1 through MC4 are arranged in the form of a matrix. The cells MC1 and MC3 are arranged in the same row and have their selection terminals connected to the common word line $WL_1$. Similarly, the memory cells MC2 and MC4 are arranged in the same row and have their selection terminals connected to the common word line $WL_2$. Also the cells MC1 and MC2 and the cells MC3 and MC4 are arranged in the same column and have their data terminals connected to the common bit lines $BL_1$ and $BL_2$, respectively.

Each of the memory cells MC1 through MC4 is comprised of one of the corresponding floating gate array transistors $Q_{P1}$-$Q_{P4}$. The array transistors $Q_{P1}$-$Q_{P4}$ function as a memory transistor for storing data "1" or "0" therein. Each of the array transistors $Q_{P1}$-$Q_{P4}$ has its gate connected to one of the rows of word lines, its drain connected to one of the columns of bit lines, and its source connected to an array ground potential VSS. The reference column 116 is comprised of a plurality of reference cells $RC_1$, $RC_2$, ... $RC_n$. Each of the reference cells $RC_1$ through $RC_n$ is comprised of one of the corresponding reference cell transistors $Q_{R1}$-$Q_{Rn}$. The gates of the array transistors and the reference cell transistor located in the same row are connected to the same word line. For example, the gates of the transistors $Q_{P1}$, $Q_{P3}$ and $Q_{R1}$ are connected to the word line $WL_1$.

The sensing circuitry 23 is comprised of a comparator 38, a reference resistive network 35 having a resistance value R, a sense ratio resistive network 37 having a value of nR, and a verify logic circuit 40. The comparator 38 is actually a sense amplifier. One end of the reference resistive network 35 is connected to a supply potential or voltage VCC, and the other end thereof is coupled to the common drain electrodes defining a reference column bit line REFCOL of the reference cell transistors. The output terminal 42 of the reference resistive network 35 is connected to the non-inverting input SAREF of the comparator 38. One end of the sense ratio resistive network 37 is also connected to the supply potential VCC, and the other end thereof is coupled to the common drain electrodes of the array transistors which are connected to the common bit line. The output terminal 44 of the sense ratio resistance network 37 is connected to the inverting input SAIN of the comparator 38. The sense ratio is defined by the number n, where n is greater than one, i.e., ranging between 2:1 to 6.5:1.

In order to change the sensing requirements to decrease the tolerance to column leakage and thus increase the endurance of the memory array, it has been discovered that this can be achieved by simply changing a sense ratio between the column leakage current and the reference current. Since it is a ratio that is important, the value of the reference resistive network 35 is actually the one which is changed in practice so as to vary the sense ratio.

Under normal programming operation, a selected memory cell will have approximately 12 volts on its gate, 5.5 volts on its drain, and 0 volts on its source. On the other hand, the deselected memory cell will have 0 volts applied to its gate. However, it will be noted that all of the drains of each cell in each column are tied together to a common bit line. Thus, even the drains of the deselected memory cells in the particular column being programmed will have 5.5 volts applied thereto. Further, it can be seen that all of the sources of the memory cells in the array are tied to the common ground potential VSS, which is typically at 0 volts.

Let us assume that the memory cell MC1 in the cell matrix 12 is to be programmed and that the memory cell MC2 in the same column has been over-erased due to previous erase operations. The programming is controlled by the state machine 28 which has a stored embedded programming algorithm. The state machine will cause the programming pulses from the pulse counter 25 to be fed to the input of the VPP generator 27. The output of the VPP generator 27 will be at 6 volts which is fed to the word line $WL_1$ via the X-decoder 14. The other remaining word lines $W_2$, ... $W_n$ will be at 0 volts since they are deselected. However, when the first pulse is sent to the word line $WL_1$ for programming the array transistor $Q_{P2}$ in the memory cell MC1, there will be column leakage current in the bit line $BL_1$ since the array transistor $Q_{P2}$ in the memory cell MC2 will have a negative threshold voltage (i.e., −3 volts) due to an over-erased condition.

Accordingly, during a program verify mode of operation the sensing circuitry 23 under the control of the state machine will effectively compare the column leakage current in the bit line $BL_1$ to the reference current in the reference column bit line REFCOL of the reference column 116. If the column leakage current is greater than the reference current indicating an over-erased bit, the output on line 50 of the sensing circuitry 23 will be at a high or "1" logic level. This means that the memory cell MC1 has not yet been program verified since there is still leakage current on the bit line $BL_1$. The state machine will be responsive to the high logic level on the line 50 and will cause a second pulse to be sent to the word line $WL_1$. Then, another program verify operation will be performed so as to determine whether the memory cell $MC_1$ has been programmed or not. This process is repeated over and over up to 6,000 programming pulses generated by the pulse counter 25.

Figure 9:
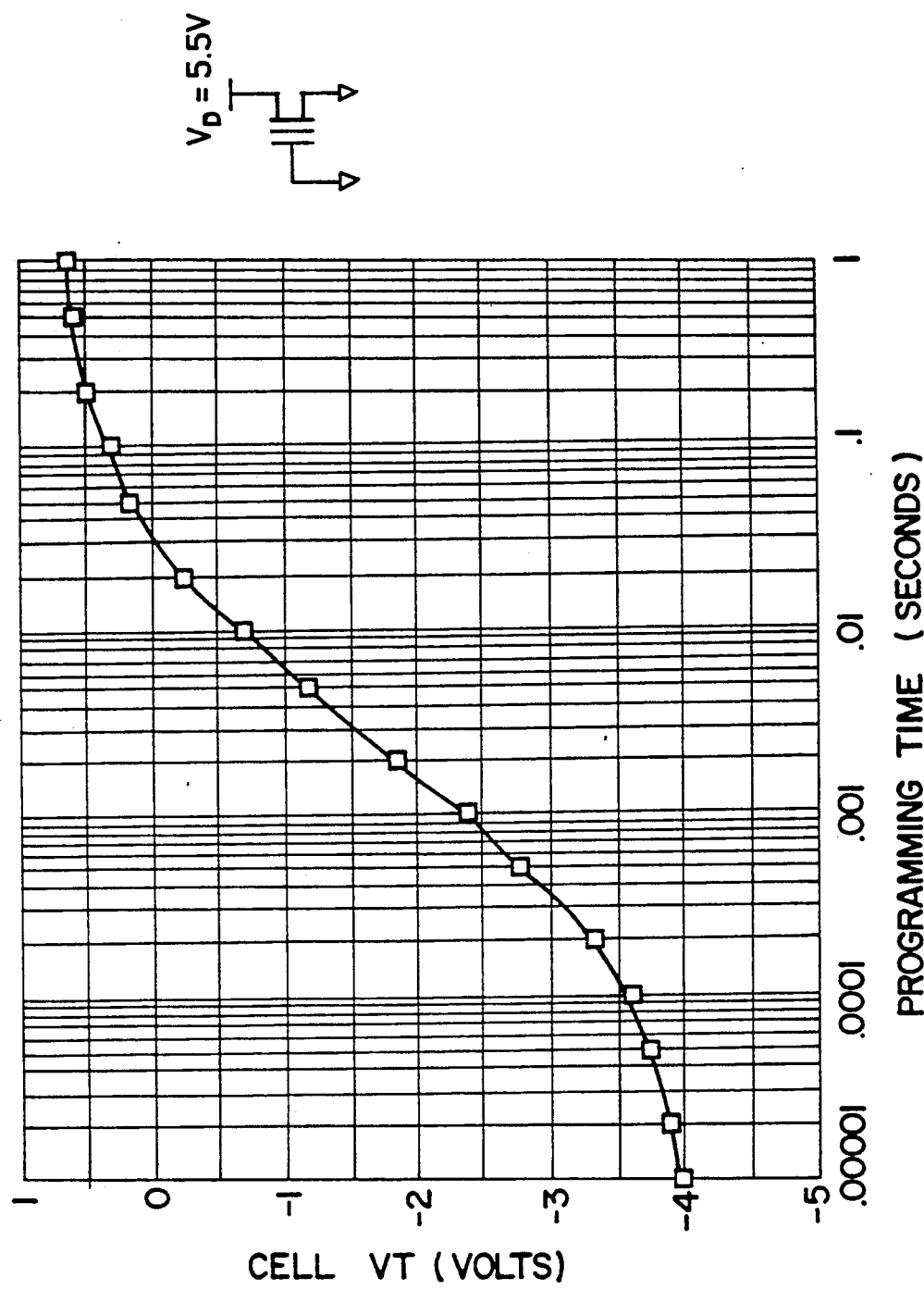
FIG. 9 is a graph of the threshold voltage of an over-erased memory cell as a function of the programming time of a cell programming on the same bit line.

Each time a programming pulse is applied to the word line $WL_1$, this will simultaneously cause the over-erased bit in the memory cell MC2 to be programmed back towards a positive threshold voltage $V_t$. There is shown in FIG. 9 an example of the threshold voltage of an over-erased bit versus the programming time. It will be noted that the threshold voltage of the over-erased bit will be changed from a negative voltage (i.e., $-4$ volts) to a positive voltage (i.e., $+1$ volt) as the programming time is increased. Therefore, by continuously applying the programming pulses (up to 6,000 each having a duration of 10 uS) during programming of the memory cell MC1 the over-erased bit MC2 will be corrected so that there will be no more leakage current on the bit line $BL_1$. Typically, the number of programming pulses needed to program back an over-erased bit is about 250.

In other words, after a predetermined number of programming pulses the column leakage current will eventually be less than the reference current and the output of the sensing circuit 23 will be switched to a low or "0" logic level indicating that the memory cell MC1 has been programmed. The state machine 28 will be responsive to the low logic level and will terminate the programming pulses from being further applied to the word line $WL_1$. It should be understood that this programming back occurred when a first cell on a particular bit line is programmed. Further, each and every one of the over-erased bits in the same bit line $BL_l$ will be corrected at this time in addition to the over-erased bit memory cell MC2.

It is generally known in the art that the higher the level or value of this column leakage current the lower the endurance of the memory will be. In order to increase the endurance of the memory array, the leakage current tolerance during the program verify operation must be decreased. Therefore, by varying the leakage current tolerance the endurance of the memory array can be easily controlled. This is because the minimum erased threshold voltage $V_t$ is determined by the amount of leakage current allowed during the program verify operation. As previously stated, the leakage current tolerance can be simply varied by changing the sense ratio during the program verify operation. Consequently, if the sense ratio is increased so as to lower the leakages current tolerance, the number of programming pulses must be increased in order to program back the over-erased bits before the sensing circuitry 23 will indicate that the selected memory cell has been programmed to a "0."

For example, assume that the reference current is set to 160 uA and the sense ratio is set to be 4. This means that the column leakage current in a particular bit line must be less than 160 uA/4 or 40 uA before the output of the sensing circuitry will be at a logic "0" indicating that there is no leakage current. By changing or increasing the sense ratio to 6.5, the column leakage current must now be less than 160 uA/6.5 or approximately 25 uA before the output of the sensing circuitry will be at the logic "0" level. This has effectively lowered or decreased the tolerance on the leakage current. As a result, the memory array will have a much higher endurance. On the other hand, if the sense ratio is changed or decreased to 2, the leakage current need only be less than 80 uA before the output of the sensing circuitry will be at the "0" logic level. Thus, the tolerance to leakage has been raised or increased. Consequently, the memory array will have a lower endurance.

The verify logic circuit 40 generates on its output control signal on line 52 which are fed to the reference resistive network 35. In the program verify mode, the values of the reference resistive network 35 will be changed or decreased with respect to the sense ratio resistive network 37 so that the sense ratio n will be increased to approximately 6.5:1. While the reference column 116 has been described to be comprised of the reference cell transistors $Q_{R1}$-$Q_{Rn}$ corresponding to the number of rows in the cell matrix 12, it should be understood to those skilled in the art that the reference column may alternatively be formed of a single reference transistor or any other number of transistors.

While the various blocks 25, 27, 37, 35 and 38 of FIG. 2 may take on various forms, suitable circuitry therefor are illustrated in respective FIGS. 3 through 8. Even though these schematic circuit diagrams are believed to be self-explanatory to those skilled in the art in view of the foregoing description, a brief description of the operation of each is believed to be in order.

In FIGS. 3(a) through 3(d), there is shown a schematic circuit diagram of the pulse counter 25 of FIG. 2. The pulse counter includes a first clock driver 302, an reset interface section 304, a second clock driver 306, a linear feedback shift register 308, a first pulse counter limiter 310, and a second pulse counter limiter 312. The pulse counter receives as its inputs an erase signal ER on terminal 301, a program verify signal PGM on terminal 303, an enable polling signal ENPOLL on terminal 305, and a pulse counter reset signal PCNTRST on terminal 307. The clock driver 302 is formed of NOR logic gates 314–320 and inverter gates 322–332. The clock driver 302 generates true and complementary pulse clock signals PCLK and PCLKB on respective lines 334 and 336. The reset interface section 304 includes inverter gates 338, 340; NOR logic gates 342, 344; N-channel transistors N302, N306; and shift registers SR1-SR3. The reset section receives as its inputs the true and complementary clock signals from the clock driver 302 and the pulse counter reset signal PCNTRST. The output pre-clock signal PRECLK of the reset interface section 304 is at the output of the NOR logic gate 344 on line 309.

The second clock driver 306 receives the pre-clock signal on line 311 from the reset section 304 and provides non-overlapping clock signals CLK and CLKB on respective lines 313 and 315. The clock driver 306 is formed of NOR logic gates 346, 348 and inverter gates 350-358. The linear feedback shift register 308 is comprised of an Exclusive OR logic gate 360, a pair of latches 362 and 364 and shift registers 366-381. It will be noted that each of the shift registers receives the non-overlapping clock signals CLK and CLKB from the second clock driver and the reset signal PCNTRST and that the outputs Q1 through Q8 are fed to the data input terminal of the next shift register. Dependent upon the number of programming pulses desired, the output of the pulse counter is selected from the outputs Q0-Q9 of the shift registers 366-382.

The first pulse counter limiter 310 is used to generate a maximum pulse count signal ERMAX during erase and is formed by NAND logic gates 384, 386; NOR logic gates 388, 390; and an inverter gate 392. In the particular implementation illustrated, the signal ERMAX at the output of the NOR gate 390 will be generated after 6,000 pulses. Similarly, the second pulse count limiter 312 is used to generate a maximum pulse count signal PGMMAX during programming and is formed by NOR logic gates 393, 394, 395; NAND logic gate 396; and inverter gates 397, 398. As shown, the signal PGMMAX at the output of the NOR gate 395 will be generated after 250 pulses. Alternately, the count signals ERMAX and PGMMAX can be made to be generated after any desired number of programming pulses by selecting the outputs of the pulse counter.

Figure 4A:
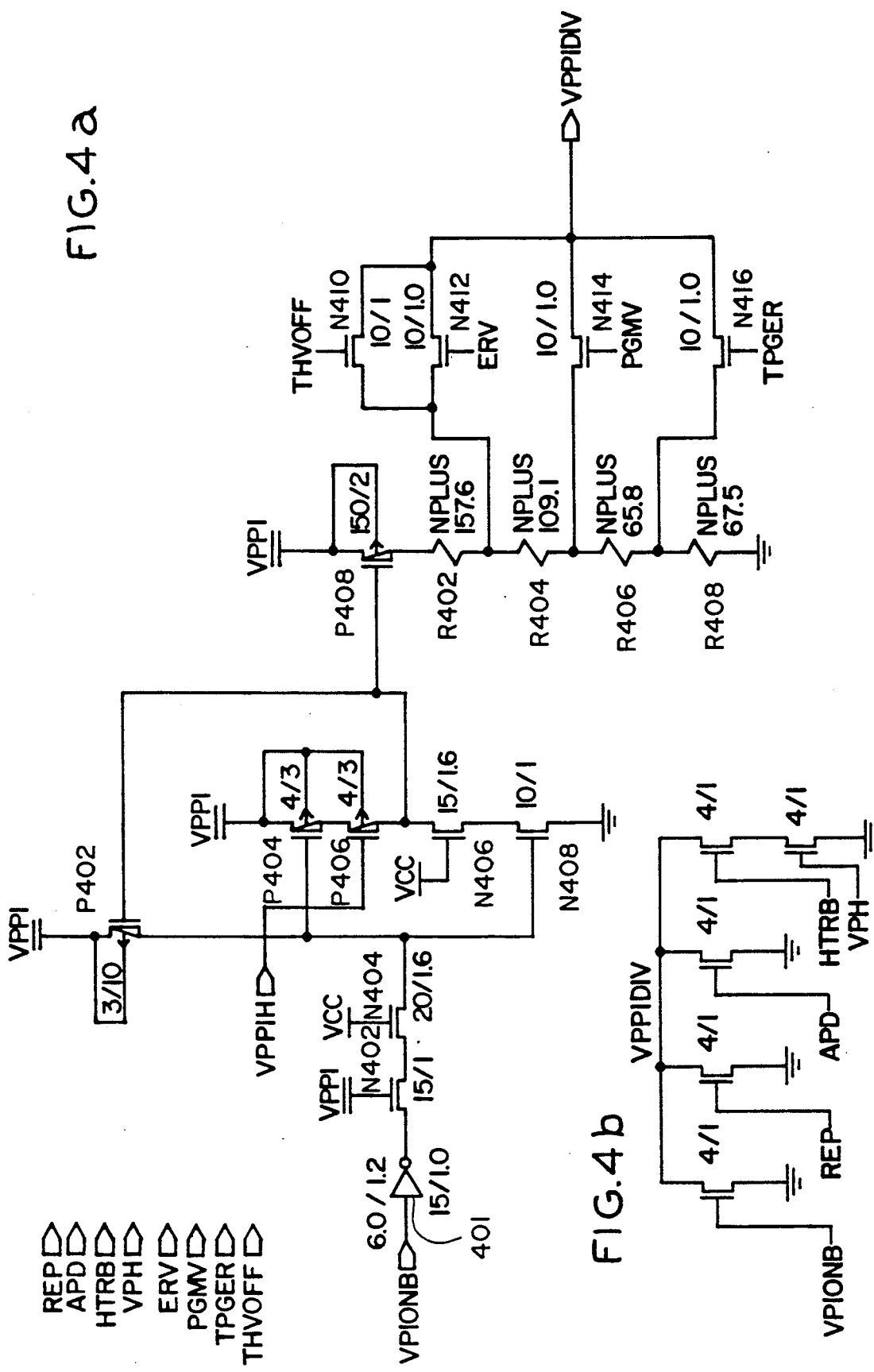
FIGS. 4(a) and 4(b) show a schematic circuit diagram of the internal VPP generator of FIG. 2.
Figure 4B:
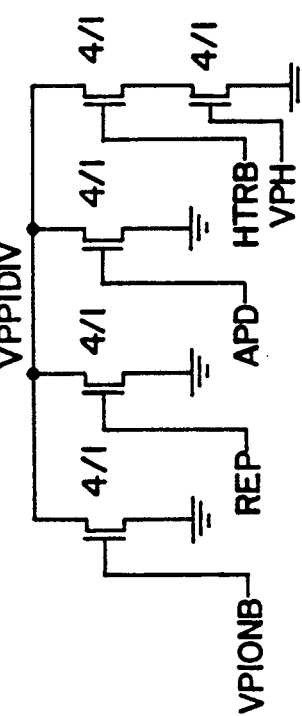

A schematic circuit diagram of the internal VPP generator 27 is depicted in FIGS. 4(a) and 4(b). The VPP generator 27 is comprised of an inverter gate 401; a pair of coupling transistors N402, N404; P-channel transistors P402-P408; load transistors N406, N408; switching transistors N410-N416; and a voltage divider formed of resistors R402-R408. In the program verify mode, the output signal VPPIDIV will be approximately +6 volts which is coupled to the selected word lines via the X-decoder 14.

Figure 5:
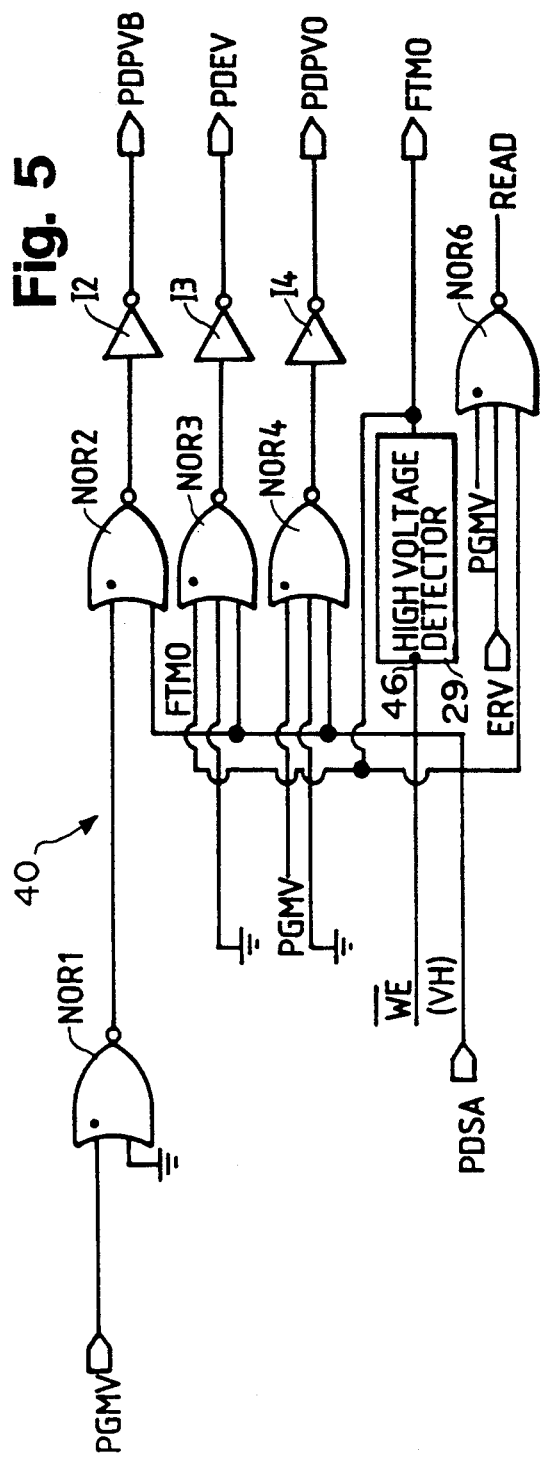
FIG. 5 is a schematic circuit diagram of the verify logic circuit of FIG. 2.

A schematic circuit diagram of the verify logic circuit 40 in FIG. 2 is illustrated in FIG. 5. The verify logic circuit receives input logic signals PGMV, READ, and ERV which are generated by the state machine 28 (FIG. 2). In response to these input signals, the verify logic circuit produces output logic control signals PDPVB, PDEB, PDPVO and FTMO. In the Table listed below, there is shown the respective logic levels of the output control signals and the corresponding sense ratios for the various mode of operations, such as modes: read mode READ, program verify mode PGMV, erase verify mode ERV, and floor test mode FTM.

TABLE

| MODE | PDPVB | PDEV | PDPVD | FTMO | n |
|---|---|---|---|---|---|
| READ | 1 | 0 | 0 | 0 | 2.0 |
| PGMV | 0 | 0 | 1 | 0 | 6.5 |
| ERV | 1 | 0 | 0 | 0 | 2.0 |
| FTM | 1 | 1 | 0 | 1 | 0.5 |

The verify logic circuit 40 includes NOR logic gates NOR2-NOR6 and inverters I2-I4. The inputs of the respective inverters I2-I4 are connected to the outputs of the corresponding logic gates NOR2-NOR4. The outputs of the inverters I2-I4 and the high voltage detector 29 provides the output control signals PDPVB, PDEV, PDPVO and FTMO. It will be noted that during the read and erase verify modes of operation the sense ratio is equal to 2. However, during the program verify mode the sense ratio is increased to 6.5 so as to determine whether an over-erased bit exists. As a result, the logic levels of the output logic control signals will be PDPVB=0, PDEV=0, PDPVO=1, and FTMO=0.

Figure 6:
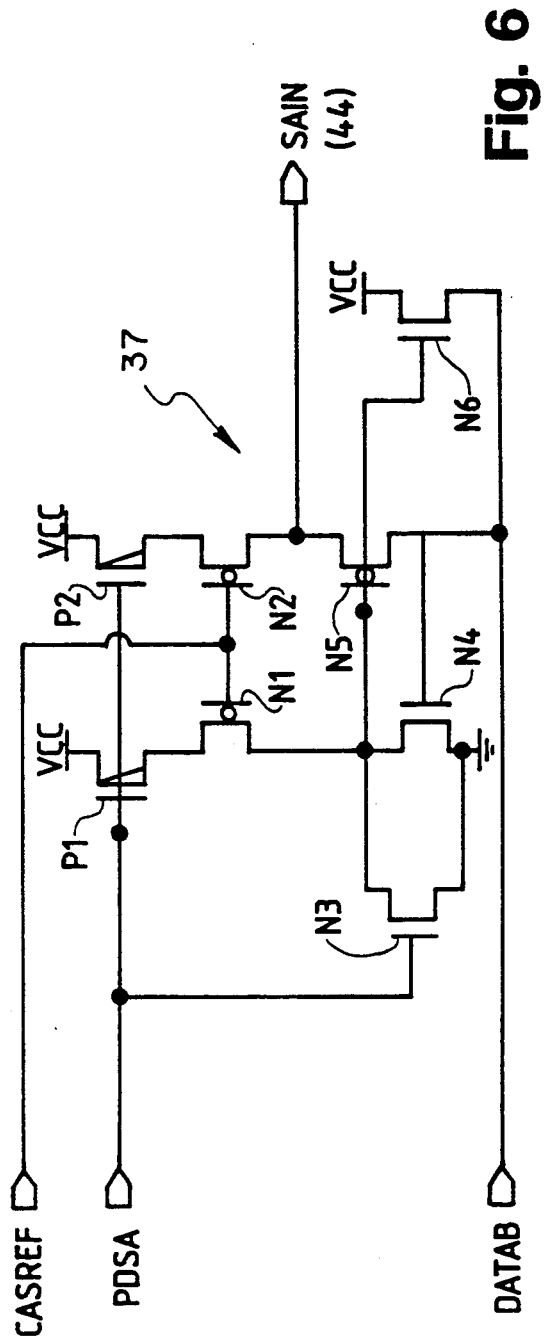
FIG. 6 is a schematic circuit diagram of the sense ratio resistive network of FIG. 2.

A schematic circuit diagram of the sense ratio resistive network 37 having a value of nR is depicted in FIG. 6. The sense ratio resistive network 37 is comprised of P-channel MOS transistors P1, P2 and N-channel MOS transistors N1-N6. The resistance value of the network 37 is determined by the transistor N2 whose source is connected to the inverting input SAIN (44) to the comparator 38. The gate of the transistor N2 receives a reference voltage CASREF, which is less than the supply voltage VCC, which is typically at +5.0 volts ±10%. The gates of the transistors P1 and P2 are connected to the power down signal PDSA, which is used to turn off the same during a power down mode in order to reduce power consumption. The node DATAB corresponds to the lower end of the network 37 and is connected to the common drains of the floating gate array transistors which are tied to the same bit line. The transistors N3-N6 are used for level shifting so as to maintain the node DATAB at a predetermined value during the various modes of operation.

Figure 7A:
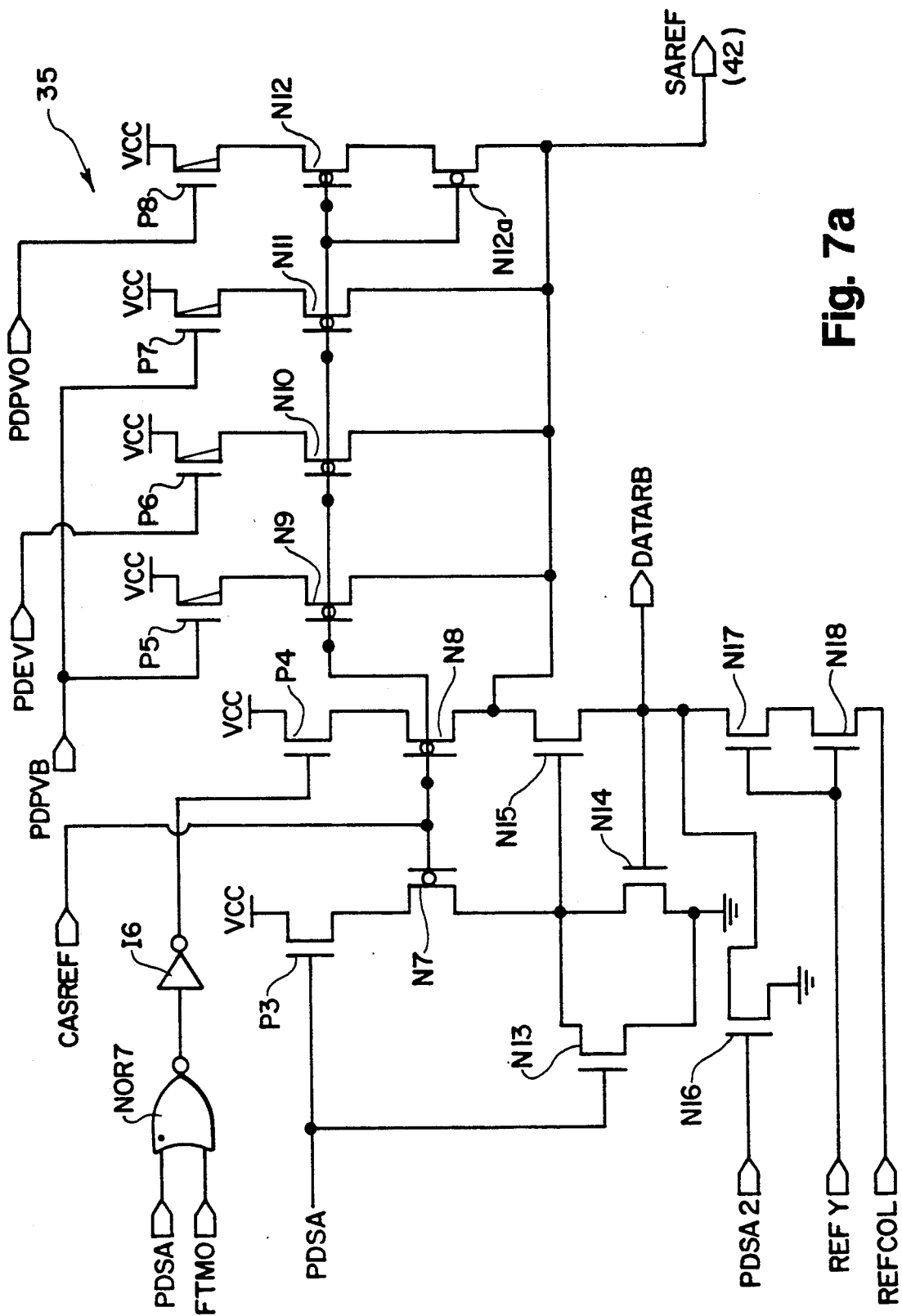
FIGS. 7(a) and 7(b) show a schematic circuit diagram of the reference resistive network of FIG. 2.
Figure 7B:
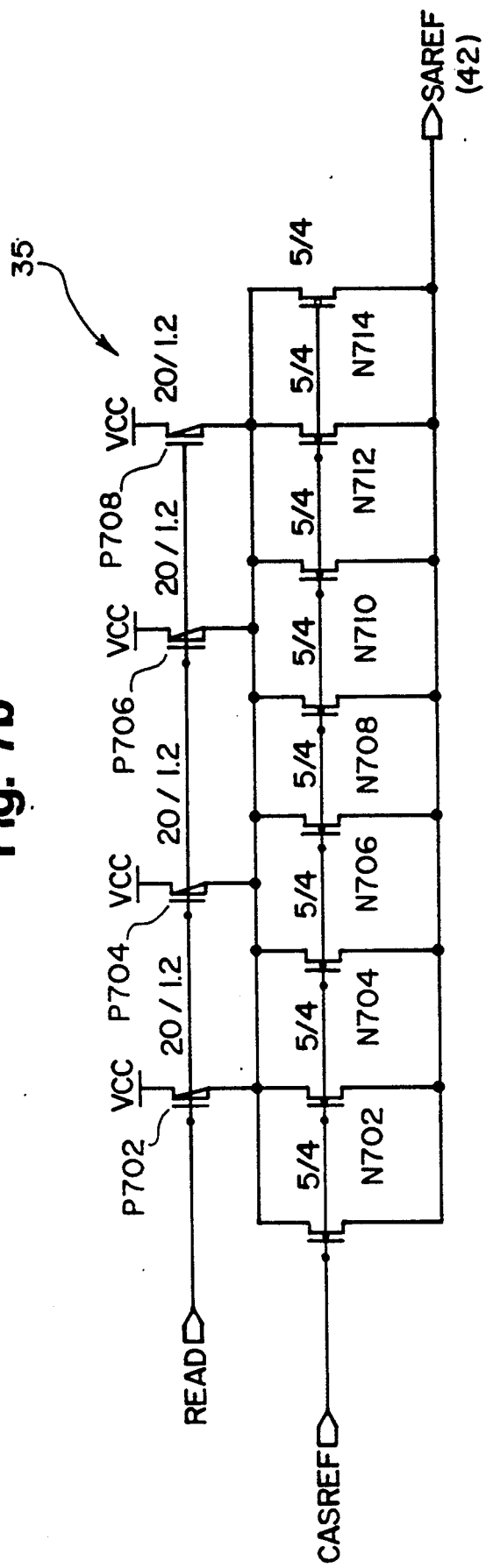

A schematic circuit diagram of the reference resistive network 35 is shown in FIG. 7(a) and 7(b). The portion of the network 35 in FIG. 7(a) is comprised of a NOR logic gate NOR7, an inverter I6, P-channel MOS transistors P3-P8, N-channel MOS transistors N7-N11, and series-connected transistors N12 and N12a. The resistance value of the network in FIG. 7(a) is determined by the transistors N8-N11 and the series-connected transistors N12 and N12a. The sizes of the transistors N8 through N12a are preferably made to be equal to the size of the transistor N2 in the sense ratio resistive network 35 (FIG. 6). The portion of the network 35 in FIG. 7(b) is comprised of P-channel MOS transistors P702-P78 and N-channel MOS transistors N702-N714.

During the read mode of operation, the circuit of FIG. 7(b) will cause the resistance at the node 42 connected to the non-inverting input SAREF of the comparator 38 to yield a sense ratio of approximately 2.0. On the other hand, during the program verify mode PGMV, the circuit of FIG. 7(b) will cause the resistance at the node 42 to be increased so that a sense ratio n ($R_{37}/R_{35}$) will be approximately 6.5. It will be noted that the node REFCOL corresponds to the lower end of the network 35 and is connected to the common drains of the reference column transistors $Q_{R1}$-$Q_{Rn}$, which is tied to the reference column bit line. The gate of the transistor N8 is connected to the reference voltage CASREF, and the gate of the transistor P3 is connected to the power down signal PDSA.

Figure 8:
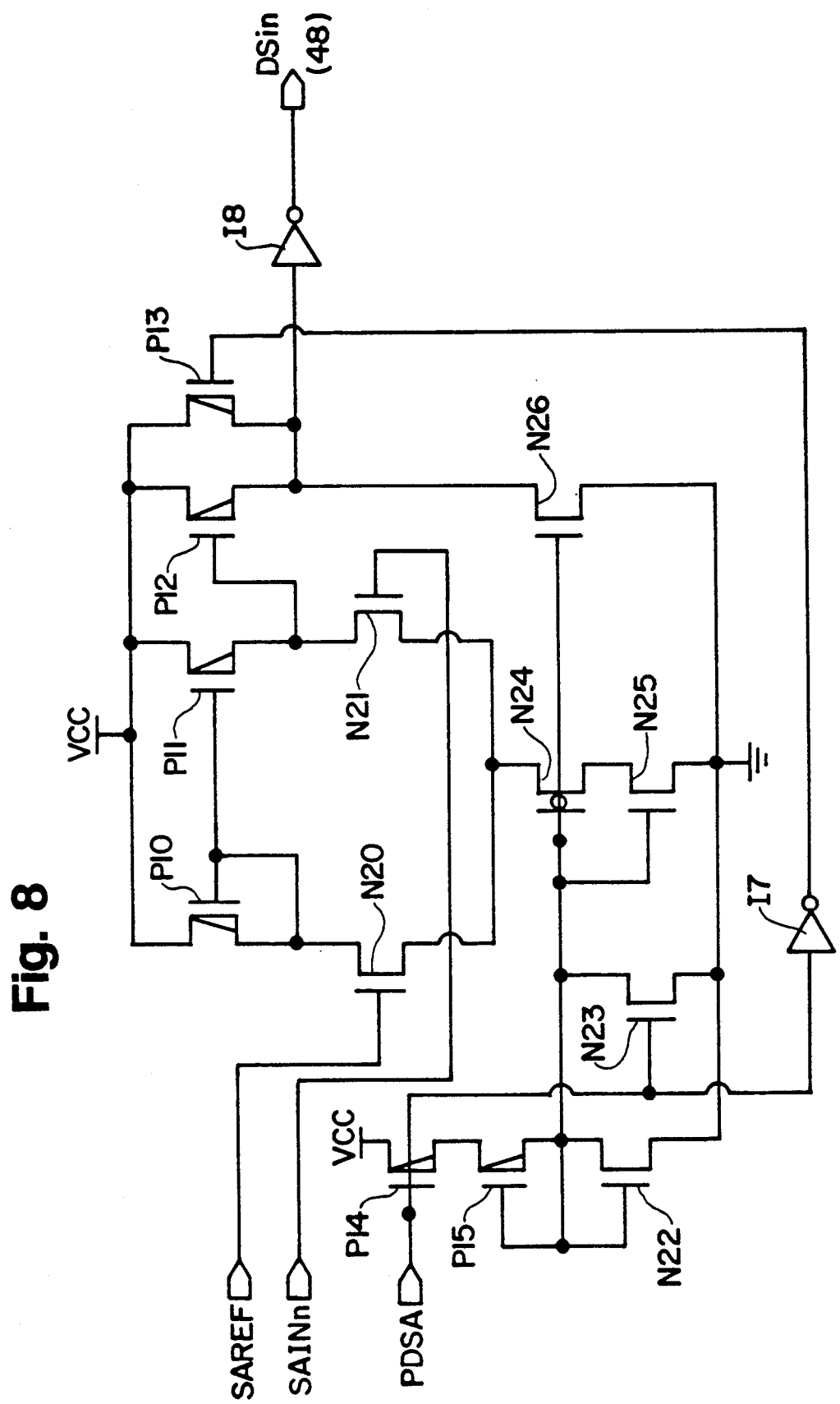
FIG. 8 is a schematic circuit diagram of the sense amplifier of FIG. 2.

A schematic circuit diagram of the comparator 38 is illustrated in FIG. 8. The comparator is comprised of inverters I7, I8; P-channel transistors P10-P15; and N-channel MOS transistors N20-N26. The transistors P14, P15 and N22 form a reference generator supplying a voltage to the gates of the current source transistors N24 and N25. The transistors N20 and N21 define the two differential input transistors and the transistors P10 and P11 serve as loads for the respective input transistors N20 and N21. The transistor P12, whose gate is connected to the drain of the input transistor N21 and whose drain is connected to the input of the inverter I8, forms an inverting amplifier with load transistor N26. The output of the inverter I8 defining the output of the comparator is connected to an output pad 48 for providing the output logic signal DSin to node 48 (line 50).

From the foregoing detailed description, it can thus be seen that the present invention provides an over-erased bit correction circuit for performing a correction operation on over-erased memory cells in an array of flash EEPROM memory cells during programing so as to render high endurance. The over-erased bit correction structure includes sensing circuitry for detecting column leakage current indicative of an over-erased bit. If an over-erased bit is determined, a pulse counter is activated so as to apply programming pulses to the control gate of the selected memory cell so as to program back a negative threshold voltage of the over-erased bits.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In a semiconductor integrated memory device having an over-erased bit correction structure for performing a correction operation on over-erased memory cells in the memory device, said correction structure comprising in combination:

a cell matrix (12) having a plurality of memory cells (MC) arrayed in rows of word lines and columns of bit lines intersecting said rows of word lines, each of said memory cells including a floating gate array transistor having its control gate connected to one of said rows of word lines, its drain connected to one of said columns of bit lines, and its source connected to a ground potential;

row decoder means (14) responsive to row address signals and being operatively connected to said cell matrix for selecting one of said rows of word lines;

column decoder means (18) responsive to column address signals and being operatively connected to said cell matrix for selecting one of said columns of bit lines;

reference column means (116) including a plurality of reference cells (RC) arrayed in rows of word lines corresponding to the number of rows in said cell matrix, each of said reference cells including a reference cell transistor ($Q_R$) having its gate connected to the same one of said rows of word lines, its drain connected to a reference bit line, and its source connected to the ground potential;

sensing circuit means (23) for comparing leakage current in the selected one of said columns of bit lines and a reference current in the reference column means during a program verify mode of operation and for generating a logic signal which is at a high logic level when said bit line leakage current is greater than said reference current indicative of an over-erased memory cell and which is at a low logic level when said bit line leakage current is less than said reference current indicative of a properly programmed memory cell; and pulse counter means (25) coupled to said row decoder means for providing a plurality of programming pulses one at a time to the selected one of said rows of word liens and to the control gate of the array transistor in a first selected memory cell to be programmed during programming of the first selected memory cell in the selected one of said columns of bit lines until said logic signal generated by said sensing circuit means is at the low logic level so as to program back simultaneously all over-erased memory cells connected to the same selected one of said columns of bit lines.

2. In a semiconductor integrated circuit memory device as claimed in claim 1, wherein said plurality of programming pulses serves to change the negative threshold of the array transistor in the over-erased memory cell to a positive threshold voltage.

3. In a semiconductor integrated circuit memory device as claimed in claim 1, wherein said sensing circuit means is comprised of sense ratio resistive network means (37) operatively connected to said columns of bit lines for generating first resistance value corresponding to the leakage current in the selected one of said columns of bit lines, reference resistive network means (35) operatively connected to said reference column means for generating a second resistance value corresponding to the reference current, and comparator means (38) having a first input coupled to said sense ratio resistive network means and a second input coupled to said reference resistive network means for comparing the leakage current and the reference current.

4. In a semiconductor integrated circuit memory device as claimed in claim 3, wherein the ratio of said first resistance value to said second resistance value is defined to be a sense ratio which is increased to approximately 6.5 during the program verify mode of operation so as to enhance the endurance of the memory device.

5. In a semiconductor integrated circuit memory device as claimed in claim 4, wherein said reference resistive network means (35) is responsive to control signals generated by a verify logic circuit (40) for changing the second resistance value relative to first resistance value so as to vary the sense ratio.

6. In a semiconductor integrated circuit memory device as claimed in claim 5, wherein said comparator means (38) comprises sense amplifier means.

7. In a semiconductor integrated circuit memory device as claimed in claim 6, wherein said sense amplifier means has an inverting input defining the first input of said comparator means and a non-inverting input defining the second input of said comparator means, and an output for providing the logic signal.

8. In a semiconductor integrated circuit memory device as claimed in claim 7, further comprising an output terminal (48) coupled to the output of said sense amplifier means (38) for providing the logic signal.

9. In a semiconductor integrated circuit memory device as claimed in claim 3, wherein the ratio of said first resistance value to said second resistance value is defined to be a sense ratio which is changed so as to set a predetermined level of the leakage current and thus the endurance of the memory device.

10. An over-erased bit correction structure for correcting over-erased memory cells in an array of flash EEPROM memory cells during program operation so as to render high endurance, said correction structure comprising:

a cell matrix (12) having a plurality of memory cells (MC) arrayed in rows of word lines and columns of bit lines intersecting said rows of word lines, each of said memory cells including a floating gate array transistor having its control gate connected to one of said rows of word lines, its drain connected to one of said columns of bit lines, and its source connected to a ground potential;

row decoder means (14) responsive to row address signals and being operatively connected to said cell matrix for selecting one of said rows of word lines;

column decoder means (18) responsive to column address signals and being operatively connected to said cell matrix for selecting one of said columns of bit lines;

reference column means (116) including a reference cell transistor ($Q_R$);

sensing circuit means (23) for comparing leakage current in the selected one of said columns of bit lines and a reference current in the reference column means during a program verify mode of operation and for generating a logic signal which is at a high logic level when said bit line leakage current is greater than said reference current indicative of an over-erased memory cell and which is at a low logic level when said bit line leakage current is less than said reference current indicative of a properly programmed memory cell; and pulse counter means (25) coupled to said row decoder means for providing a plurality of programming pulses one at a time to the selected one of said rows of word lines and to the control gate of the array transistor in a first selected memory cell to be programmed during programming of the first selected memory cell in the selected one of said columns of bit lines until said logic signal generated by said sensing circuit means is at the low logic level so as to program back simultaneously all over-erased memory cells connected to the same selected one of said columns of bit lines.

11. An over-erased bit correction structure as claimed in claim 10, wherein said plurality of programming pulses serves to change the negative threshold of the array transistor in the over-erased memory cell to a positive threshold voltage.

12. An over-erased bit correction structure as claimed in claim 10, wherein said sensing circuit means is comprised of sense ratio resistive network means (37) operatively connected to said columns of bit lines for generating first resistance value corresponding to the leakage current in the selected one of said columns of bit lines, reference resistive network means (35) operatively connected to said reference column means for generating a second resistance value corresponding to the reference current, and comparator means (28) having a first input coupled to said sense ratio resistive network means and a second input coupled to said reference resistive network means for comparing the leakage current and the reference current.

13. An over-erased bit correction structure as claimed in claim 12, wherein the ratio of said first resistance value to said second resistance value is defined to be a sense ratio which is increased to approximately 6.5 during the program verify mode of operation so as to enhance the endurance of the memory device.

14. An over-erased bit correction structure as claimed in claim 13, wherein said reference resistive network means (35) is responsive to control signals generated by a verify logic circuit (40) for changing the second resistance value relative to first resistance value so as to vary the sense ratio.

15. An over-erased bit correction structure as claimed in claim 14, wherein said comparator means (38) comprises sense amplifier means.

16. An over-erased bit correction structure as claimed in claim 15, wherein said sense amplifier means has an inverting input defining the first input of said comparator means and a non-inverting input defining the second input of said comparator means, and an output for providing the logic signal.

17. An over-erased bit correction structure as claimed in claim 16, further comprising an output terminal (48) coupled to the output of said sense amplifier means (38) for providing the logic signal.

18. An over-erased bit correction structure as claimed in claim 17, wherein the ratio of said first resistance value to said second resistance value is defined to be a sense ratio which is changed so as to set a predetermined level of the leakage current and thus the endurance of the memory device.

* * * * *

UNITED STATES PATENT AND TRADEMARK OFFICE
CERTIFICATE OF CORRECTION

PATENT NO. : 5,335,198

DATED : August 2, 1994

INVENTOR(S) : Michael A. Van Buskirk et al.

It is certified that error appears in the above-identified patent and that said Letters Patent is hereby corrected as shown below:

Column 3, line 53, after "together", insert -- , --.

Column 11, line 51, "liens", should be --lines--.

Signed and Sealed this

Eleventh Day of October, 1994

Attest:

BRUCE LEHMAN

Attesting Officer    Commissioner of Patents and Trademarks